(12) United States Patent
van Zeijl

(10) Patent No.: US 6,268,779 B1
(45) Date of Patent: Jul. 31, 2001

(54) INTEGRATED OSCILLATORS AND TUNING CIRCUITS

(75) Inventor: Paul T. M. van Zeijl, Hengelo (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/434,166

(22) Filed: Nov. 4, 1999

Related U.S. Application Data
(60) Provisional application No. 60/125,245, filed on Mar. 19, 1999.

(51) Int. Cl.[7] .............................. H03B 5/12; H01L 29/00; H01L 29/93
(52) U.S. Cl. ................................ 331/117 FE; 331/108 C; 331/117 R; 331/177 V; 257/532; 257/535
(58) Field of Search ............................. 331/36 C, 108 C, 331/117 R, 117 D, 117 FE, 177 V; 257/532–535

(56) References Cited

U.S. PATENT DOCUMENTS

| | | | |
|---|---|---|---|
| 4,344,223 | * 8/1982 | Bulger et al. | 29/577 |
| 4,458,215 | 7/1984 | Huang et al. | 331/117 |
| 4,536,724 | 8/1985 | Hasegawa et al. | 331/177 |
| 4,703,286 | 10/1987 | Muterspaugh | 331/117 |
| 4,855,801 | * 8/1989 | Kuesters | 357/23.6 |
| 4,969,032 | 11/1990 | Scheitlin et al. | |
| 5,107,233 | 4/1992 | Stoft | 333/168 |
| 5,173,835 | 12/1992 | Cornett et al. | |
| 5,175,884 | 12/1992 | Suarez | 455/260 |
| 5,187,451 | 2/1993 | Nakamoto et al. | 331/99 |
| 5,292,677 | * 3/1994 | Dennison | 437/52 |
| 5,405,790 | 4/1995 | Rahim et al. | 437/34 |
| 5,488,333 | 1/1996 | Vig | 331/66 |
| 5,532,651 | 7/1996 | Jager et al. | 331/96 |
| 5,539,359 | 7/1996 | Goma | 331/117 |
| 5,564,100 | 10/1996 | Huang et al. | 455/319 |
| 5,650,754 | 7/1997 | Joshi et al. | 331/36 |
| 5,694,092 | 12/1997 | Oba et al. | 331/117 |
| 5,821,827 | 10/1998 | Mohwinkel et al. | 331/99 |
| 5,838,207 | 11/1998 | Zhou et al. | 331/36 |
| 5,856,763 | 1/1999 | Reeser et al. | 331/49 |
| 5,905,414 | 5/1999 | Motoi | 332/130 |
| 5,946,567 | 8/1999 | Weng et al. | |
| 6,040,616 | * 3/2000 | Dennis et al. | 257/535 |

FOREIGN PATENT DOCUMENTS

| | | |
|---|---|---|
| 0072647 | 2/1983 | (EP) . |
| 96/17386 | 6/1996 | (WO) . |

\* cited by examiner

Primary Examiner—David Mis
(74) Attorney, Agent, or Firm—Burns, Doane, Swecker & Mathis, L.L.P.

(57) ABSTRACT

An integrated Voltage controlled oscillator (VCO) includes varactors and fixed capacitors formed in a "stacked" arrangement. Forming the VCO integrated circuit by "stacking" fixed capacitors upon underlying varactors frees up semiconductor surface area for use by other circuit components or permits the implementation of a smaller integrated circuit package. "Stacking" further permits a decrease in parasitic capacitance associated with interconnections between the fixed capacitors and other components of the VCO.

26 Claims, 5 Drawing Sheets

INTEGRATED OSCILLATORS AND TUNING CIRCUITS

This application claims benefit to U.S. provisional application 60/125,245 filed Mar. 19, 1999.

BACKGROUND

The present invention relates generally to integrated circuits, and more specifically, to integrated circuits containing active circuitry and fixed capacitors.

Voltage tuneable capacitors (varactors) and fixed capacitors are conventionally used together in a wide variety of different electrical circuits. Such circuits include, for example, tuneable circuits (e.g., lowpass, highpass, bandpass, or bandstop filters) or voltage controlled oscillators (VCO's). In such circuits, the varactor is used in conjunction with a variable applied voltage, and one or more fixed capacitors, to "tune" the output of the circuit. In the case of filter circuits, the voltage applied to the varactor is varied to "tune" the output voltage response of the filter as a function of the frequency of the input signal. An example of a conventional varactor-tuned filter is disclosed in U.S. Pat. No. 5,107,233. In the case of a VCO, the voltage applied to the varactor is varied to "tune" the output frequency of the oscillator. An example of a conventional varactor-controlled oscillator is disclosed in U.S. Pat. No. 5,694,092.

Tuneable filter circuits and VCO's have applicability in a wide variety of electrical devices including devices that require the use of integrated circuitry due to constraints on acceptable circuit dimensions. Such constraints are common in circuitry contained in many commercially available devices, including for example, transceiver circuitry contained in mobile radio telephones. The use of integrated circuits in such devices permits the circuitry to be disposed within smaller housings thus allowing for easier portability of the overall device. Tuneable filter circuits and VCO's are therefore commonly fabricated as semiconductor integrated circuits in many devices. An example of a monolithic integrated VCO is disclosed in U.S. Pat. No. 4,458,215 to Huang. As shown in FIGS. 1 and 2 of this patent, the varactors (52, 54, 56, 68) and fixed capacitors (15, 16) are typically fabricated on a specified area of a semiconductor substrate (20). Drawbacks with this conventionally configured integrated circuit include, however, a relatively large surface area due to the side by side disposition of the varactors (52, 54, 56, 68) and capacitors (15, 16) and the parasitic capacitance associated with the relatively lengthy interconnections used between the VCO components. The total cost of an integrated circuit, which includes a circuit such as the VCO disclosed in Huang, is a function of the amount of semiconductor area consumed by the fabricated circuitry. Furthermore, the distance between components disposed side by side in an integrated circuit increases the parasitic capacitance associated with the interconnections between components. This parasitic capacitance can reduce the tuneable range of the VCO and otherwise be detrimental to VCO performance. The side by side disposition of the varactors and fixed capacitors of conventional integrated circuits such as Huang therefore increases the parasitic capacitance associated with the integrated circuit and the relative cost associated with constructing the integrated circuit.

SUMMARY OF THE INVENTION

It is thus an object of exemplary embodiments of the invention to fabricate an integrated circuit, that includes one or more active circuits and one or more fixed capacitors, which reduces the semiconductor surface area consumed by the disposition of the components of the integrated circuit and/or the associated parasitic capacitance of the integrated circuit.

One exemplary embodiment of the invention achieves the above described objects and includes an integrated circuit which comprises a first portion of the integrated circuit having a first surface and comprising one or more layers of semiconductor material. The integrated circuit of this exemplary embodiment further comprises a capacitor comprising at least one conductive layer and a dielectric layer, wherein the capacitor is formed upon the first surface of the first portion of the integrated circuit.

These and other objects and features will be apparent from this written description and appended drawings. The foregoing is provided as a convenient summary, the invention to be protected being defined by the patent claims and equivalents thereof.

BRIEF DESCRIPTION OF THE DRAWINGS

The objects and advantages of the invention will be understood by reading the following detailed description in conjunction with the drawings in which.

DETAILED DESCRIPTION

Figure 1:
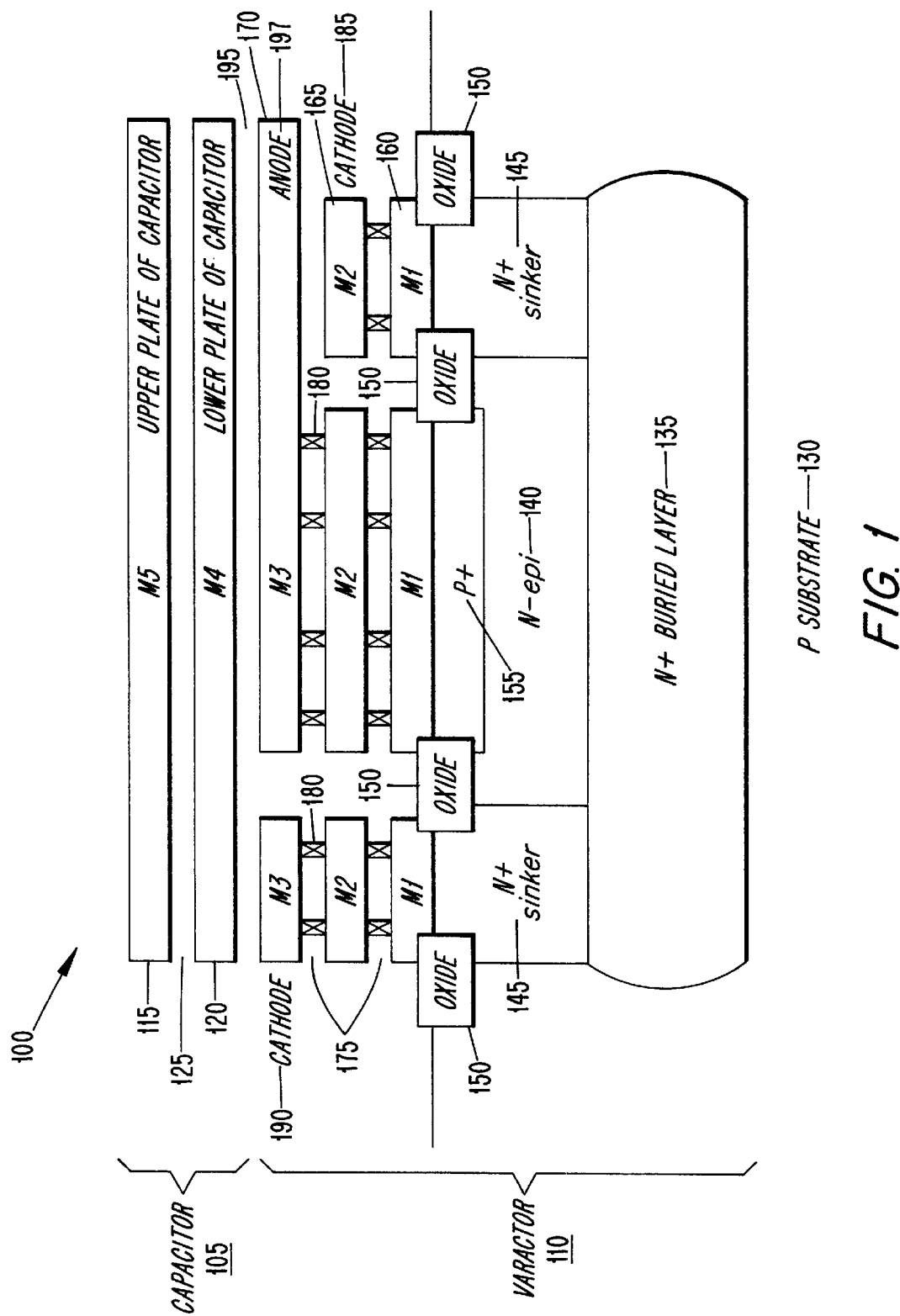
FIG. 1 is a structural diagram of the layer structure of an exemplary embodiment of the present invention employing a varactor and fixed capacitor.

According to exemplary embodiments of the present invention, an active circuit such as a varactor, and a fixed capacitor, can be fabricated in a semiconductor integrated circuit in such a manner as to reduce the semiconductor surface area dedicated to the active circuit/fixed capacitor combination and to possibly minimize parasitic capacitances. FIG. 1 illustrates an exemplary layer structure 100 of a combination varactor 110 and fixed capacitor 105 of the present invention. In the exemplary embodiment shown, the fixed capacitor 105 comprises two conductive layers 115 and 120 with an intervening insulating layer 125 (e.g., SiO, $SiO_2$, GaAs, ZnS, $MgF_2$). Conductive layers 115 and 120 can be composed of materials such as Al, Ti, W, or AlCu, though one skilled in the art will recognize that other appropriate conductive materials may be used. The capacitor 105 is fabricated on a surface of the varactor 110, instead of the substrate 130, thus requiring less surface area of the integrated circuit to be dedicated to the varactor/capacitor combination. Furthermore, disposition of the capacitor 105 upon a surface of the varactor 110 may permit a decrease in the length of any interconnections between the varactor and capacitor or between the varactor and capacitor and surrounding circuitry. In particular, parasitic capacitance can be minimized in the case where the circuit configuration requires a direct electrical connection between the varactor 110 and capacitor 105 portions of the integrated circuit. In such a case, disposition of the capacitor 105 upon a surface of the varactor 110 will permit the interconnection length between the two to be minimized, in turn, minimizing parasitic capacitance.

A CMOS process can be used to fabricate the layer structure 100 of the exemplary embodiment illustrated in FIG. 1. One skilled in the art will recognize, however, that the layer structure 100 can be fabricated using other known processes including, for example, BICMOS, SiGe, or GaAs processes. In the exemplary CMOS process, a N+ buried layer 135 is formed in the P substrate 130 and an N– epitaxial layer 140. A dopant is further implanted in the epitaxial layer 140 to form the N+ sinker regions 145. A P conductivity type doping material is also implanted in the epitaxial layer 140 to create the P+ region 155. Insulating regions 150 (e.g., SiO, SiO2, GaAs, ZnS, $MgF_2$) are further formed between the N+ sinker regions 145 and P+ region 155. In forming the above described layers or regions, one skilled in the art will appreciate that the materials and doping concentrations used for each layer/region will be process dependent. For example, in silicon processes, B, As, Sb, P, Ga and In dopants can be used with doping concentrations generally in the range of $10^{16}$ to $10^{20}$ per $cm^3$.

To obtain a low-ohmic connection, conductive layers M1 160, M2 165, and M3 170 are formed upon the N+ sinker regions 145, the insulating regions 150, and the P+ region 155. Conductive layers 160, 165, and 170 can be composed of materials such as Al, Ti, W, or AlCu, though one skilled in the art will recognize that other appropriate conductive materials may be used. An insulating layer 175 (e.g., SiO, SiO2, GaAs, ZnS, MgF2) is formed between each of the conductive layers and vias 180 can be used to connect each conductive layer to the next layer. First portions of conductive layers M1 and M2 form a first cathode electrode 185. Second portions of conductive layers M1 and M2 and a first portion of conductive layer M3 form a second cathode electrode 190. Third portions of M1 and M2 and a second portion of M3 form an anode electrode 197. To obtain a high-Q of the varactor, cathode electrodes 185 and 190 can be shorted together (not shown).

As an interstitial layer between the varactor 110 and the capacitor 105, a further insulating layer 195 is formed upon conductive layer M3 170. However, if a substantially direct connection between conductive layers M4 120 and M3 170 is required, then vias (not shown) may be used to interconnect M4 120 with either the cathode electrode 190 or anode electrode 197. Use of vias to interconnect the M4 120 and M3 170 layers will ensure a low parasitic capacitance.

To fabricate capacitor 105, conductive layer M4 120 is formed upon insulating layer 195 to create the lower plate of the capacitor 105. Insulating layer 125 is then formed upon conductive layer M4 120 and conductive layer M5 115 is formed upon insulating layer 125 to create the upper plate of the capacitor 105. As will be appreciated by one skilled in the art, the formation of each of the above described layers of the varactor 110 and capacitor 105 can be performed using any conventional techniques appropriate for the layer being established including, but not limited to, growth or deposition techniques.

Figure 2:
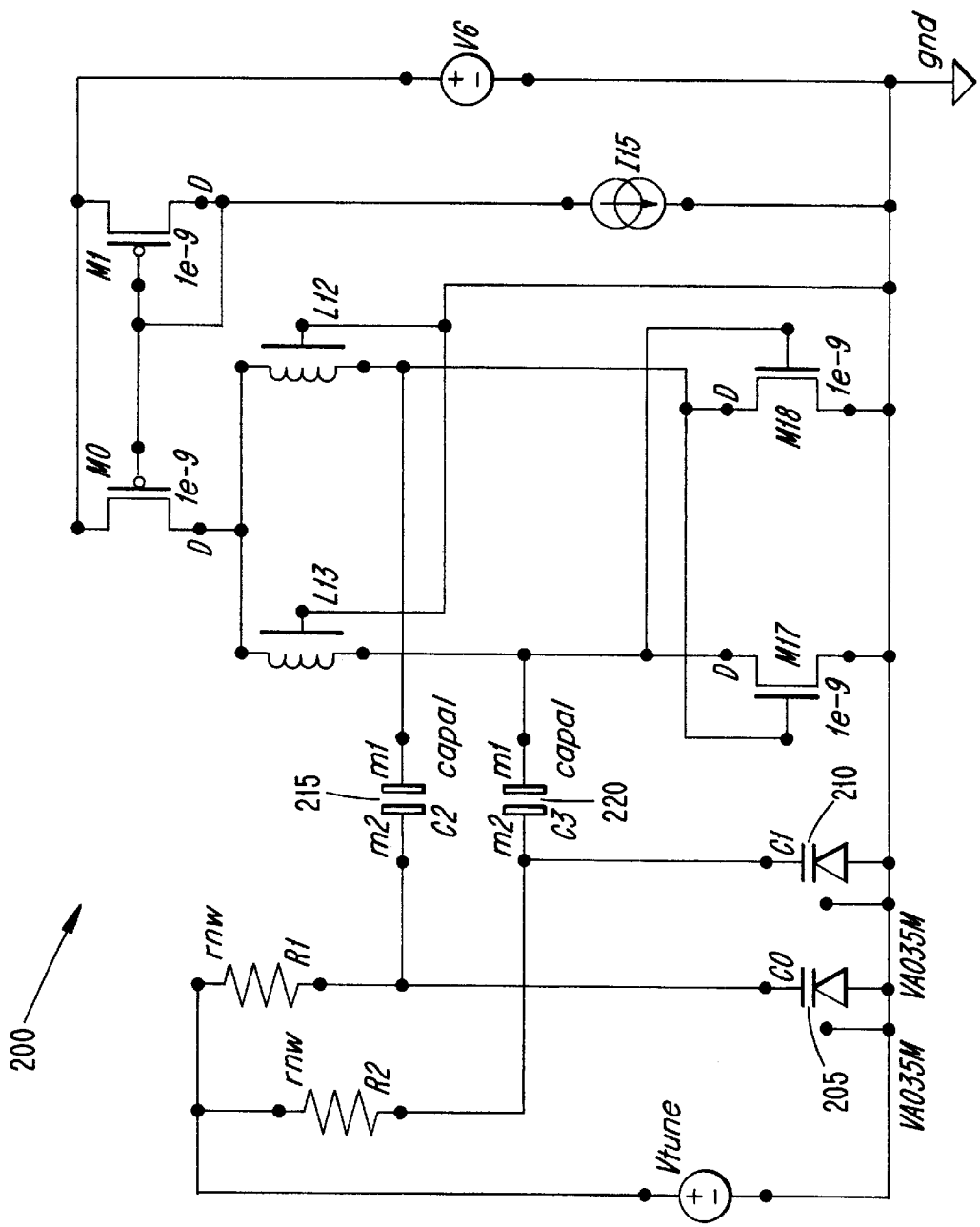
FIG. 2 is a schematic diagram of a voltage controlled oscillator of another exemplary embodiment of the invention.
Figure 3:
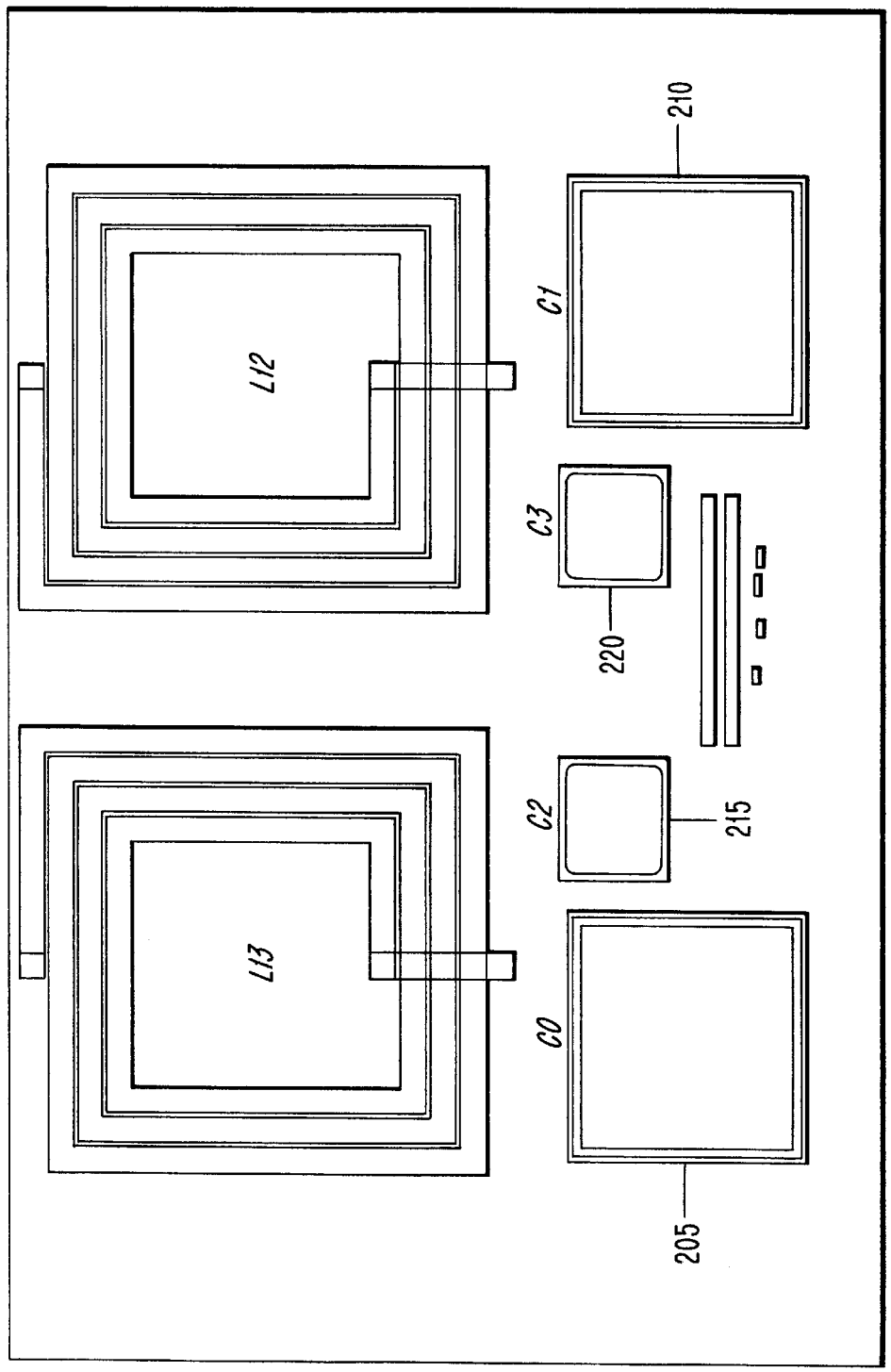
FIG. 3 is a layout of VCO components in accordance with conventional techniques.
Figure 4:
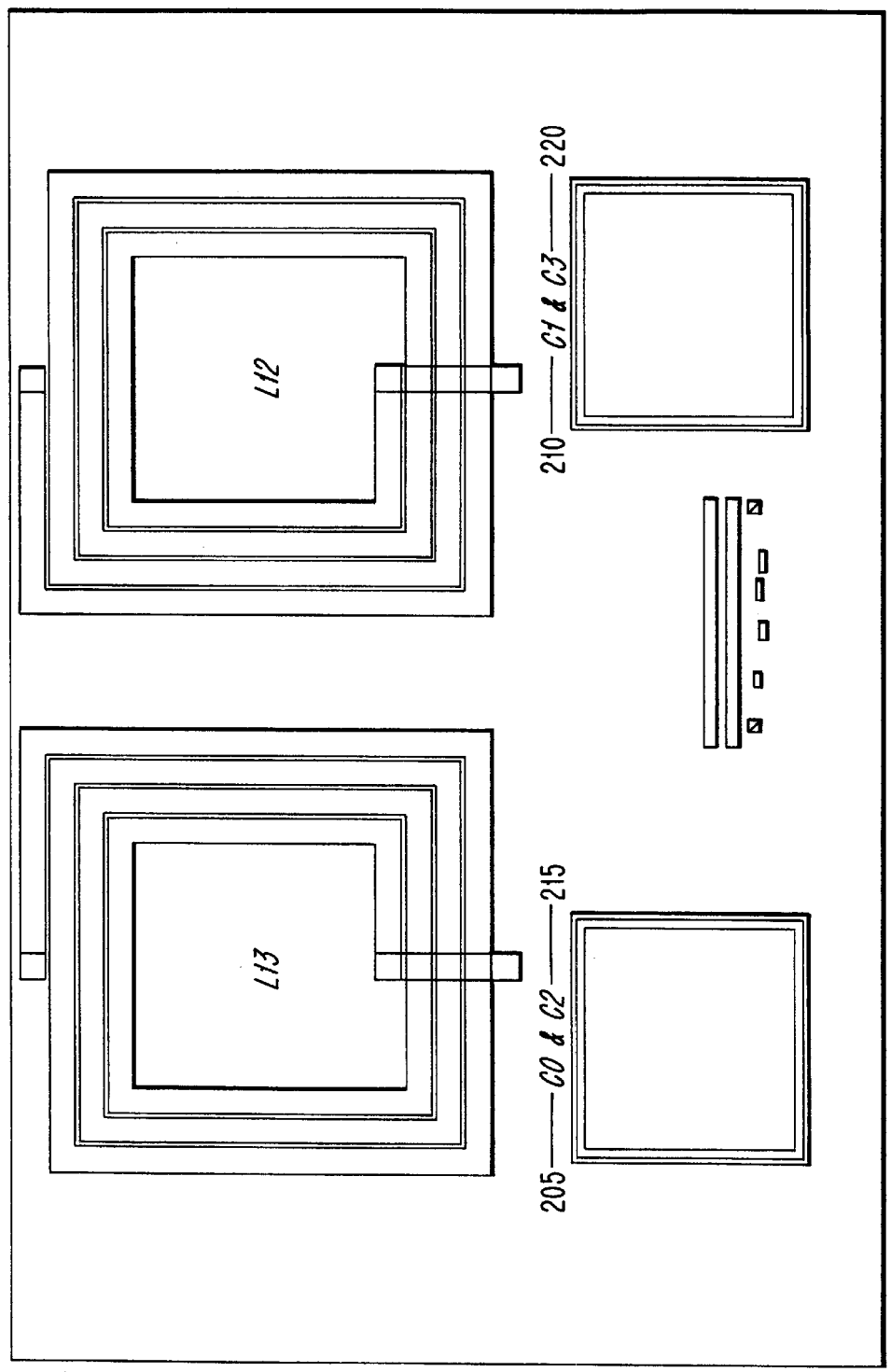
FIG. 4 is a layout of the VCO in accordance with exemplary embodiments of the invention.

In a second exemplary embodiment, the capacitor 105 and varactor 110 combination illustrated in FIG. 1 can be used in an exemplary voltage controlled oscillator 200, as shown in FIG. 2, fabricated in an Application Specific Integrated Circuit (ASIC). In the VCO of FIG. 2, each of C0 205 and C2 215, and C1 210 and C3 220, can correspond to a single varactor/capacitor combination shown in the layer structure of FIG. 1. Using a conventional integrated circuit configuration, with varactors C0 205 and C1 210 disposed side by side on the surface of the semiconductor, a surface layout such as that shown in FIG. 3 would result. In accordance with the present invention, however, "stacking" the capacitor 105 upon the varactor 110 advantageously permits a reduction in the amount of surface area required for the capacitor/varactor combination and thus, a smaller ASIC, or more surface area available for other circuit components. This is illustrated in FIG. 4, where capacitor C2 215 is disposed over varactor C0 205 and capacitor C3 220 is disposed over varactor C1 210.

Figure 5:
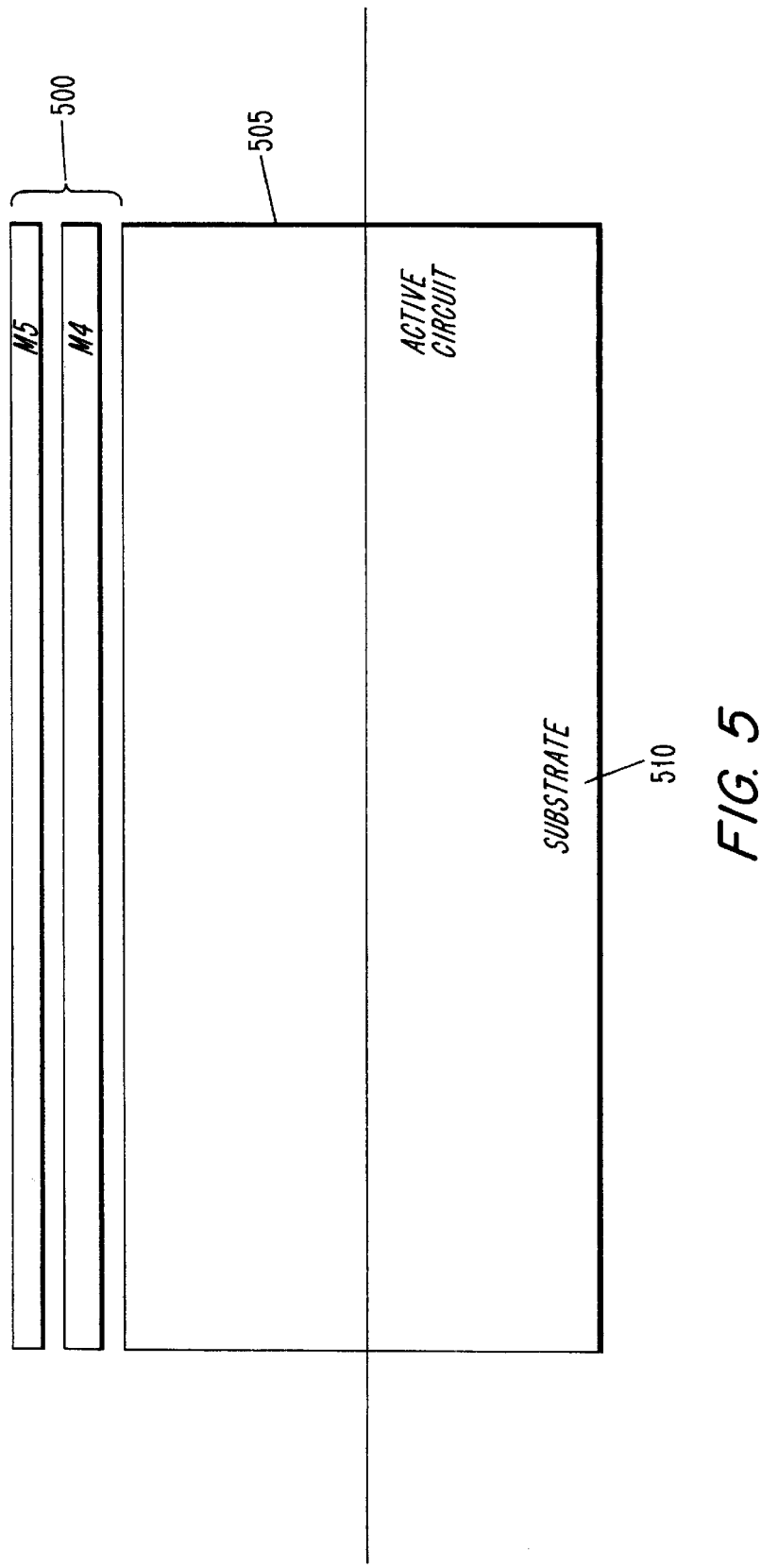
FIG. 5 is a structural diagram of the layer structure of an exemplary embodiment of the invention employing an active circuit and a fixed capacitor.

One skilled in the art will recognize that, even though an exemplary VCO is described with respect to FIG. 2, any number of different ASIC's can use the varactor/capacitor layer structure illustrated in FIG. 1. Such ASIC's could include, for example, tuneable filter arrangements such as tuneable lowpass, highpass, bandpass, or bandstop filters which use both a varactor and capacitor. One skilled in the art will further recognize that the exemplary embodiments of the invention can be broadly applied to any active circuitry contained within an integrated circuit that additionally uses one or more capacitors. As shown in FIG. 5, a capacitor layer structure 500 can be "stacked" upon any active circuit 505, instead of formed on the substrate 510, for the purpose of conserving semiconductor surface area and permitting an increase in the packaging density of the ASIC. Active circuit 505 can include, for example, a mixer, an amplifier, an analog-to-digital or digital-to-analog converter, a demodulator, a modulator, or a power or current controlled oscillator.

Although a number of embodiments are described herein for purposes of illustration, these embodiments are not meant to be limiting. Those of ordinary skill in the art will recognize modifications that can be made in the illustrated embodiment. Such modifications are meant to be covered by the spirit and scope of the appended claims.

What is claimed is:

1. An integrated circuit comprising:
   a first portion of the integrated circuit, said first portion comprising one or more layers of silicon based semiconductor material and a varactor having a first surface; and
   a capacitor comprising at least one conductive layer and a dielectric layer, wherein the capacitor is formed upon the first surface of the varactor of the integrated circuit, and wherein the at least one conductive layer of said capacitor is formed during standard silicon wafer processing.

2. The integrated circuit of claim 1, wherein the first portion of the integrated circuit includes a first layer and wherein a surface of the first layer forms said first surface.

3. The integrated circuit of claim 1, wherein the varactor includes one or more anode electrodes and one or more cathode electrodes and wherein either the one or more anode electrodes or the one or more cathode electrodes are formed from one or more conductive layers.

4. The integrated circuit of claim 1, wherein the integrated circuit is an oscillator.

5. The integrated circuit of claim 4, wherein the oscillator is a voltage controlled oscillator.

6. The integrated circuit of claim 4, wherein the oscillator is a current controlled oscillator.

7. The integrated circuit of claim 4, wherein the oscillator is a power controlled oscillator.

8. The integrated circuit of claim 1, wherein the integrated circuit is a mixer.

9. The integrated circuit of claim 1, wherein the integrated circuit is an amplifier.

10. The integrated circuit of claim 1, wherein the integrated circuit is an analog-to-digital converter.

11. The integrated circuit of claim 1, wherein the integrated circuit is a digital-to-analog converter.

12. The integrated circuit of claim 1, wherein the integrated circuit is a modulator.

13. The integrated circuit of claim 1, wherein the integrated circuit is a demodulator.

14. The integrated circuit of claim 1, wherein the integrated circuit is a filter.

15. The integrated circuit of claim 1, wherein the integrated circuit is a tuneable filter.

16. The integrated circuit of claim 1, wherein the integrated circuit is formed sing a CMOS process.

17. The integrated circuit of claim 1, wherein the integrated circuit is formed using a BICMOS process.

18. The integrated circuit of claim 1, wherein the integrated circuit is formed using a SiGe process.

19. The integrated circuit of claim 1, wherein the one or more layers comprise a plurality of layers of semiconductor material.

20. The integrated circuit of claim 2, wherein said first layer is comprised of an insulating material.

21. The integrated circuit of claim 2, wherein at least a portion of said first layer is comprised of a conductive material.

22. The integrated circuit of claim 3, wherein the one or more cathode electrodes comprises at least two cathode electrodes.

23. The integrated circuit of claim 22, wherein the at least two cathode electrodes are shorted together.

24. The integrated circuit of claim 20, wherein the insulating material is selected from the group consisting of SiO, and $SiO_2$.

25. The integrated circuit of claim 1, wherein the at least one conductive layer is formed from materials selected from the group consisting of Al, Ti, W, and AlCu.

26. The integrated circuit of claim 3, wherein the one or more conductive layers are formed from materials selected from the group consisting of Al, Ti, W, and AlCu.

* * * * *